United States Patent [19]
Nguyen

[11] Patent Number: 5,343,094
[45] Date of Patent: Aug. 30, 1994

[54] LOW NOISE LOGIC AMPLIFIER WITH NONDIFFERENTIAL TO DIFFERENTIAL CONVERSION

[75] Inventor: Thai M. Nguyen, Santa Clara, Calif.

[73] Assignee: National Semiconductor Corporation, Santa Clara, Calif.

[21] Appl. No.: 4,136

[22] Filed: Jan. 13, 1993

[51] Int. Cl.$^5$ .................. H03K 19/092; H03K 17/16
[52] U.S. Cl. ..................................... 307/475; 307/443
[58] Field of Search ................. 307/475, 473, 443

[56] References Cited

U.S. PATENT DOCUMENTS

| | | | |
|---|---|---|---|
| 3,976,984 | 8/1976 | Hirasawa | 340/173 R |
| 4,161,663 | 7/1979 | Martinez | 307/264 |
| 4,437,171 | 3/1984 | Hudson et al. | 365/177 |
| 4,532,436 | 7/1985 | Bismarck | 307/475 |
| 4,585,958 | 4/1986 | Chung et al. | 307/473 |
| 4,605,871 | 8/1986 | Price et al. | 307/475 |
| 4,645,951 | 2/1987 | Uragami | 307/475 |
| 4,656,372 | 4/1987 | Sani et al. | 307/475 |
| 4,656,375 | 4/1987 | Lauffer et al. | 307/475 |
| 4,703,199 | 10/1987 | Ely | 307/264 |
| 4,782,250 | 11/1988 | Adams et al. | 307/473 |
| 4,782,251 | 11/1988 | Tsugaru et al. | 307/475 |
| 4,897,565 | 1/1990 | Shimizu | 307/475 |
| 4,912,437 | 3/1990 | Morris | 307/475 |
| 4,947,061 | 8/1990 | Metz et al. | 307/475 |
| 4,978,870 | 12/1990 | Chen et al. | 307/475 |
| 4,982,108 | 1/1991 | Connell et al. | 307/264 |
| 4,998,028 | 3/1991 | Chappell et al. | 307/475 |
| 5,043,604 | 8/1991 | Komaki | 307/475 |
| 5,047,671 | 9/1991 | Suthar et al. | 307/451 |
| 5,099,151 | 3/1992 | Watanabe | 307/475 |
| 5,101,123 | 3/1992 | Ten Eyck | 307/475 |
| 5,117,134 | 5/1992 | Aso | 307/475 |
| 5,122,689 | 6/1992 | Barre | 307/475 |
| 5,122,692 | 6/1992 | Seki | 307/475 |
| 5,132,572 | 7/1992 | Woo | 307/475 |
| 5,132,573 | 7/1992 | Tsuru et al. | 307/475 |
| 5,138,196 | 8/1992 | Satou et al. | 307/446 |
| 5,140,196 | 8/1992 | Shepherd | 307/475 |
| 5,148,059 | 9/1992 | Chen et al. | 307/475 |

Primary Examiner—Edward P. Westin
Assistant Examiner—Richard Roseen
Attorney, Agent, or Firm—Limbach & Limbach

[57] ABSTRACT

A low noise logic amplifier with an input signal converter and a differential logic amplifier which together receive and convert a nondifferential input logic signal to a differential output logic signal. The input signal converter receives the nondifferential logic signal and converts it to a differential input logic signal for the differential logic amplifier. The differential logic amplifier has two output signal current paths for its bias current. The input signal converter provides the differential input logic signal with a delay between its two differential logic phases such that at least one of the two output signal current paths in the differential logic amplifier is continuously conducting the bias current. Thus, during generation of the differential output logic signal, regardless of whether the differential input logic signal is experiencing a high-to-low or low-to-high logic transition, the differential logic amplifier bias current flows continuously and without interruption, thereby minimizing generation of noise spikes from abrupt changes in bias current flow.

52 Claims, 13 Drawing Sheets

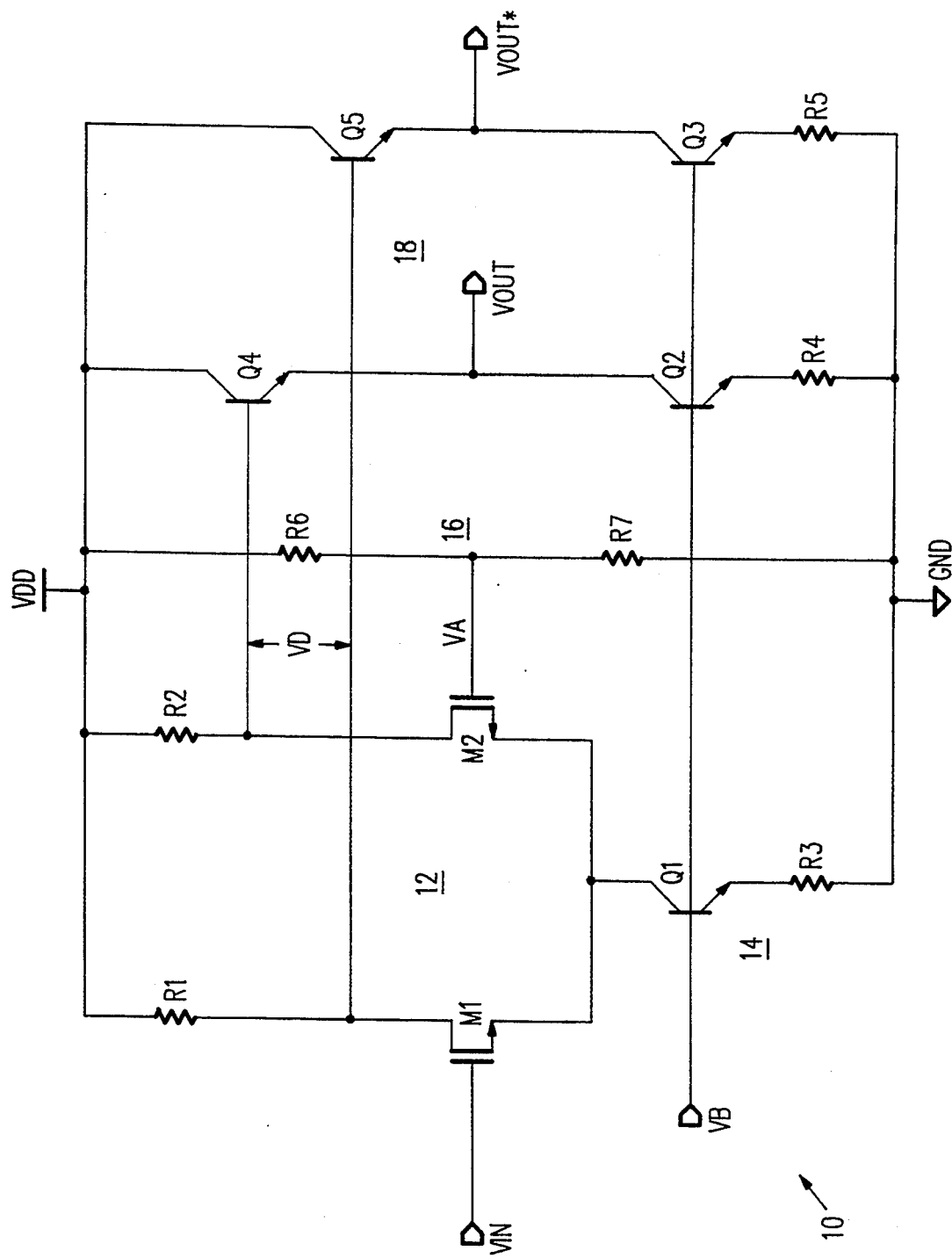
PRIOR ART
FIG. 1

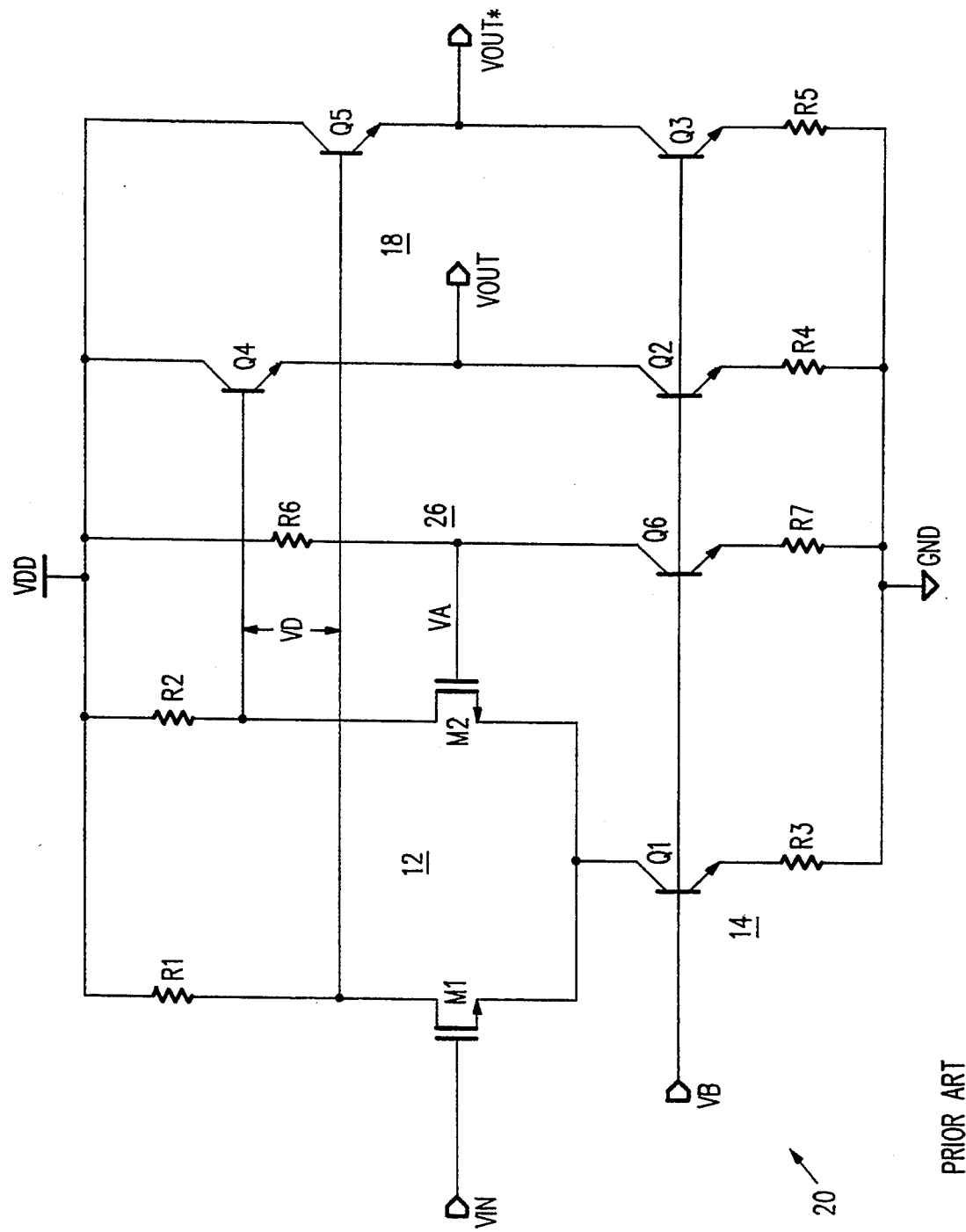
PRIOR ART
FIG. 2

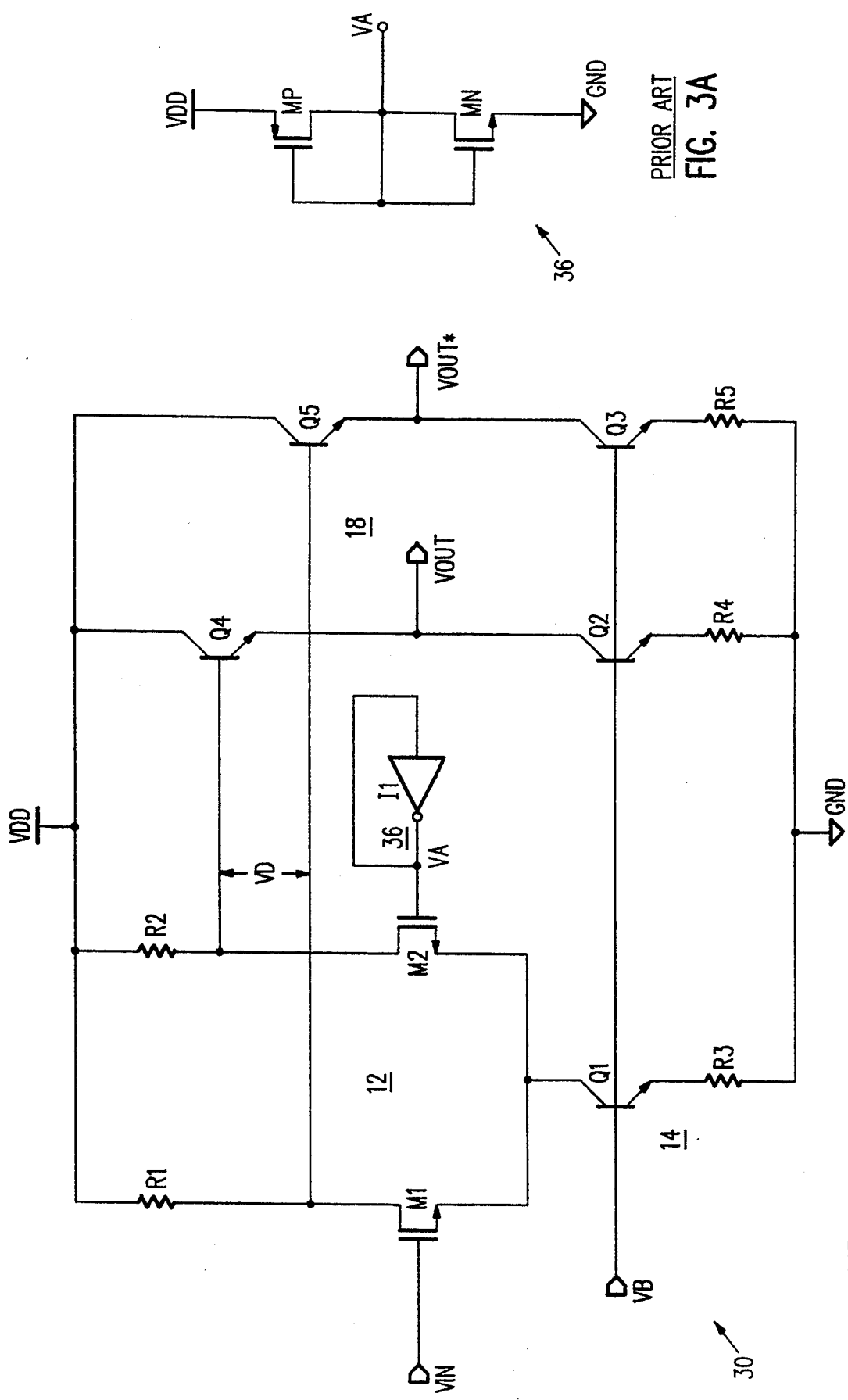
PRIOR ART
FIG. 3A
PRIOR ART
FIG. 3

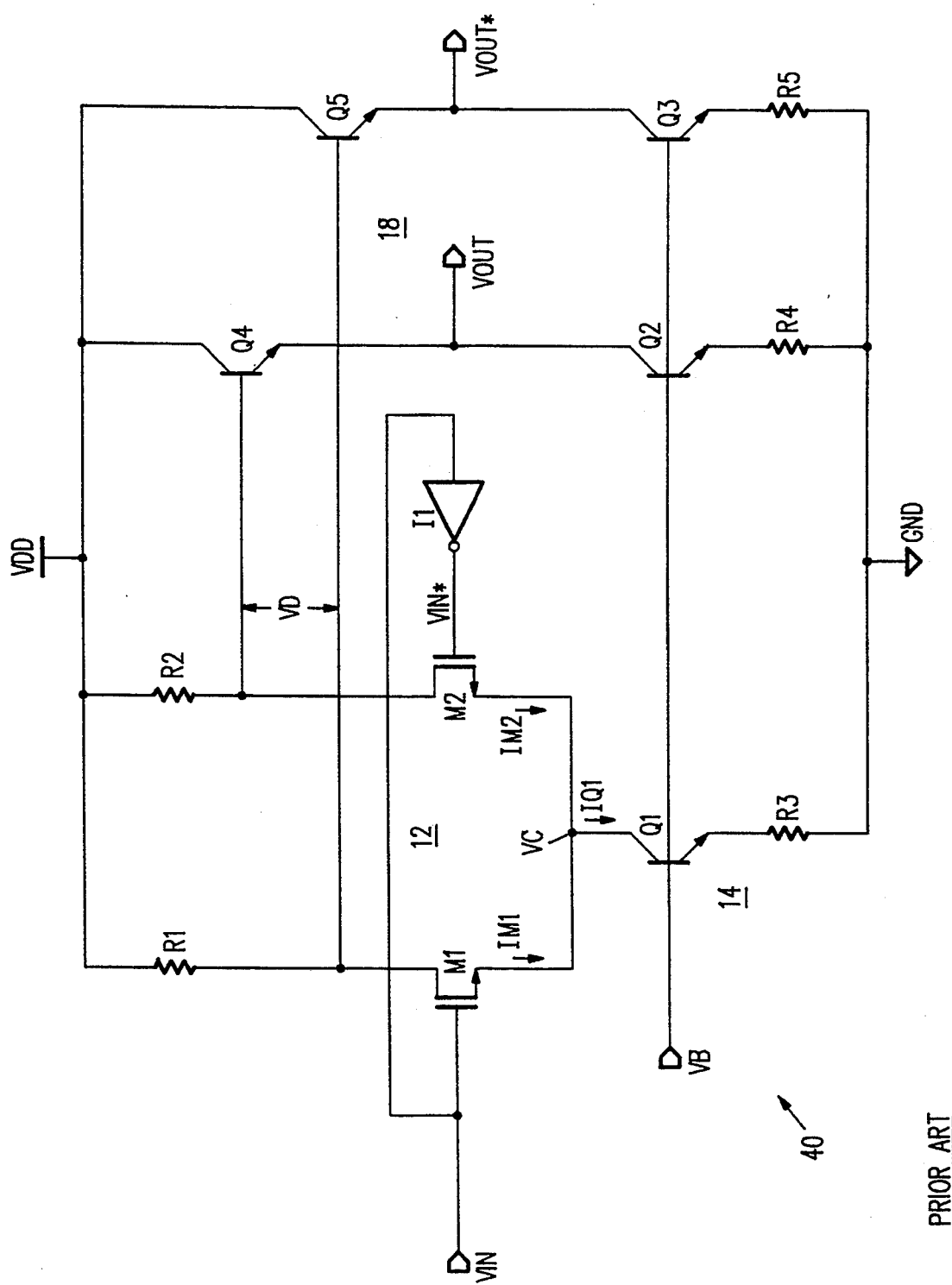
PRIOR ART
FIG. 4

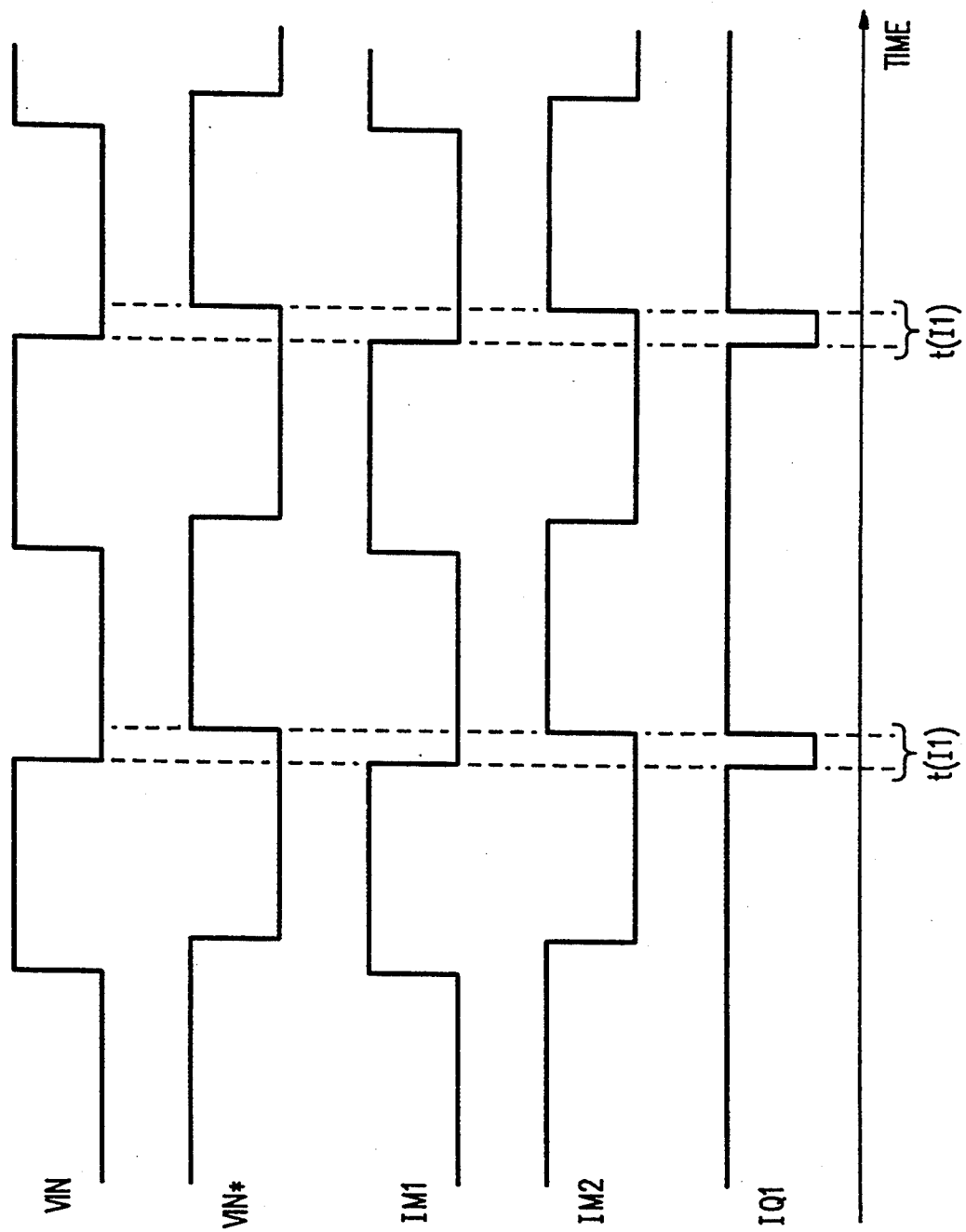
PRIOR ART
FIG. 5A

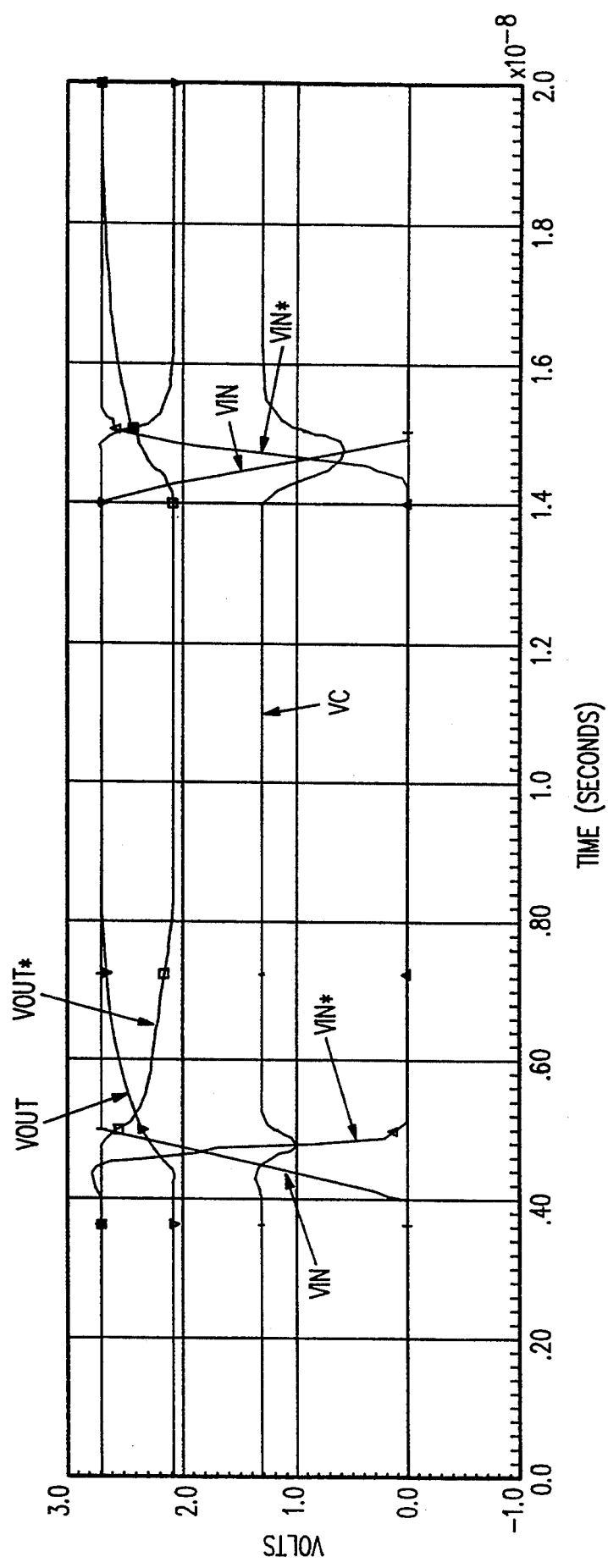
PRIOR ART
FIG. 5B

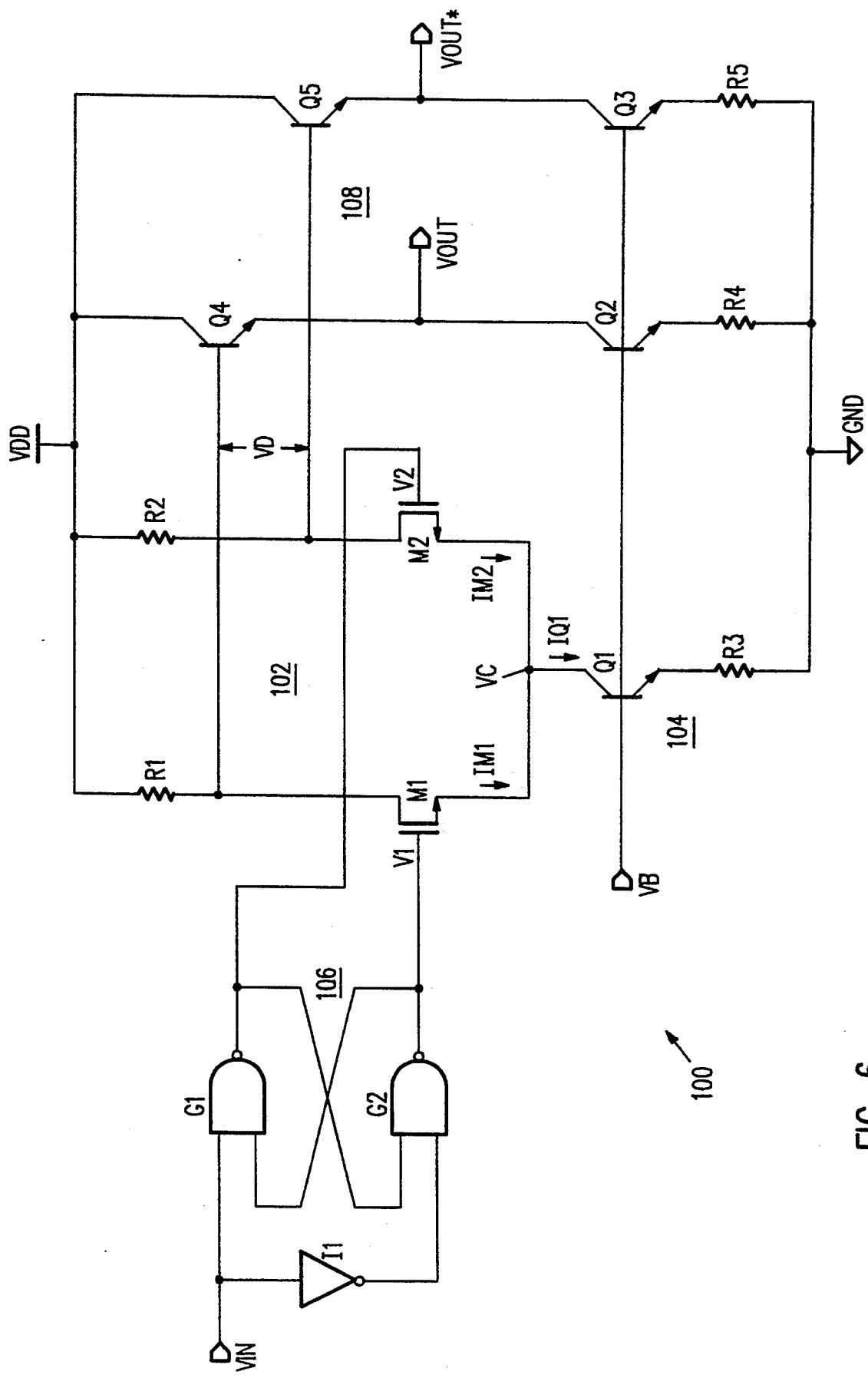
FIG. 6

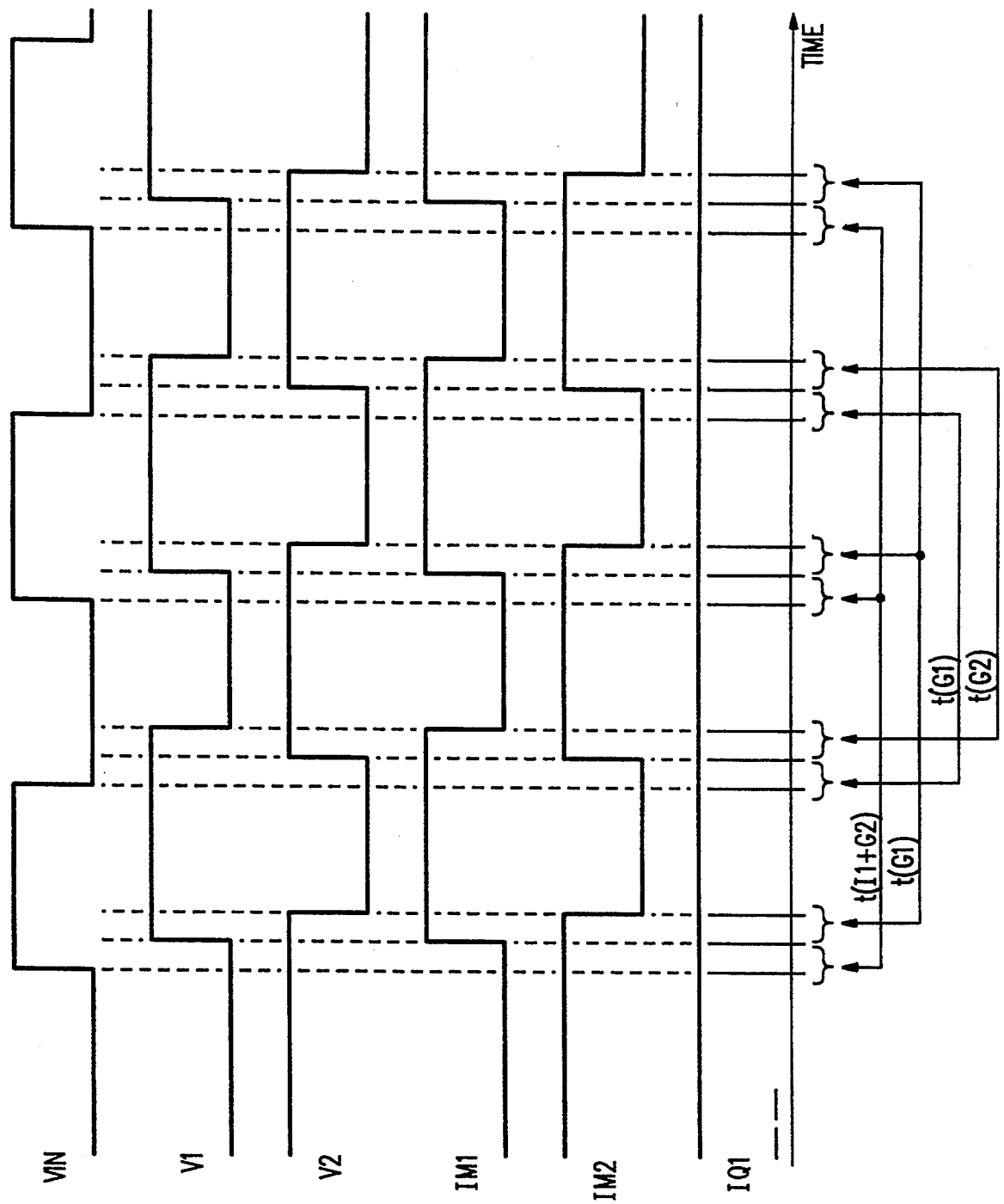
FIG. 7A

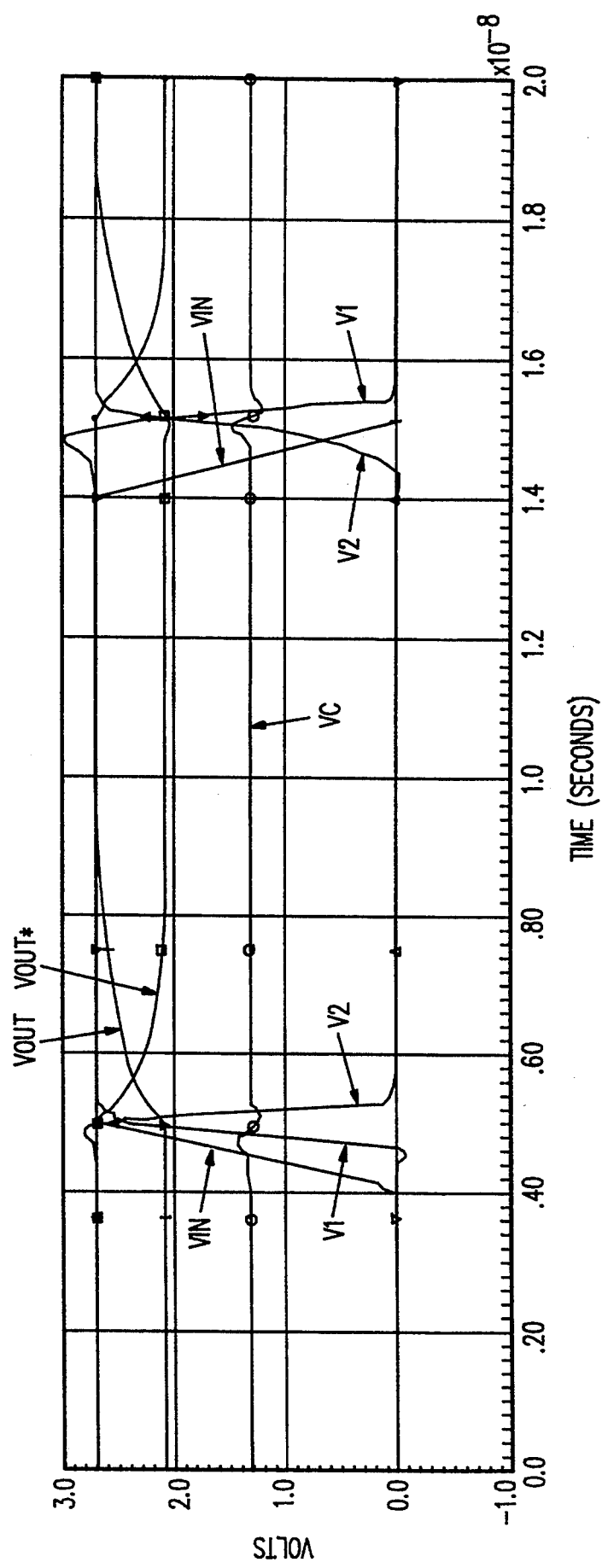
FIG. 7B

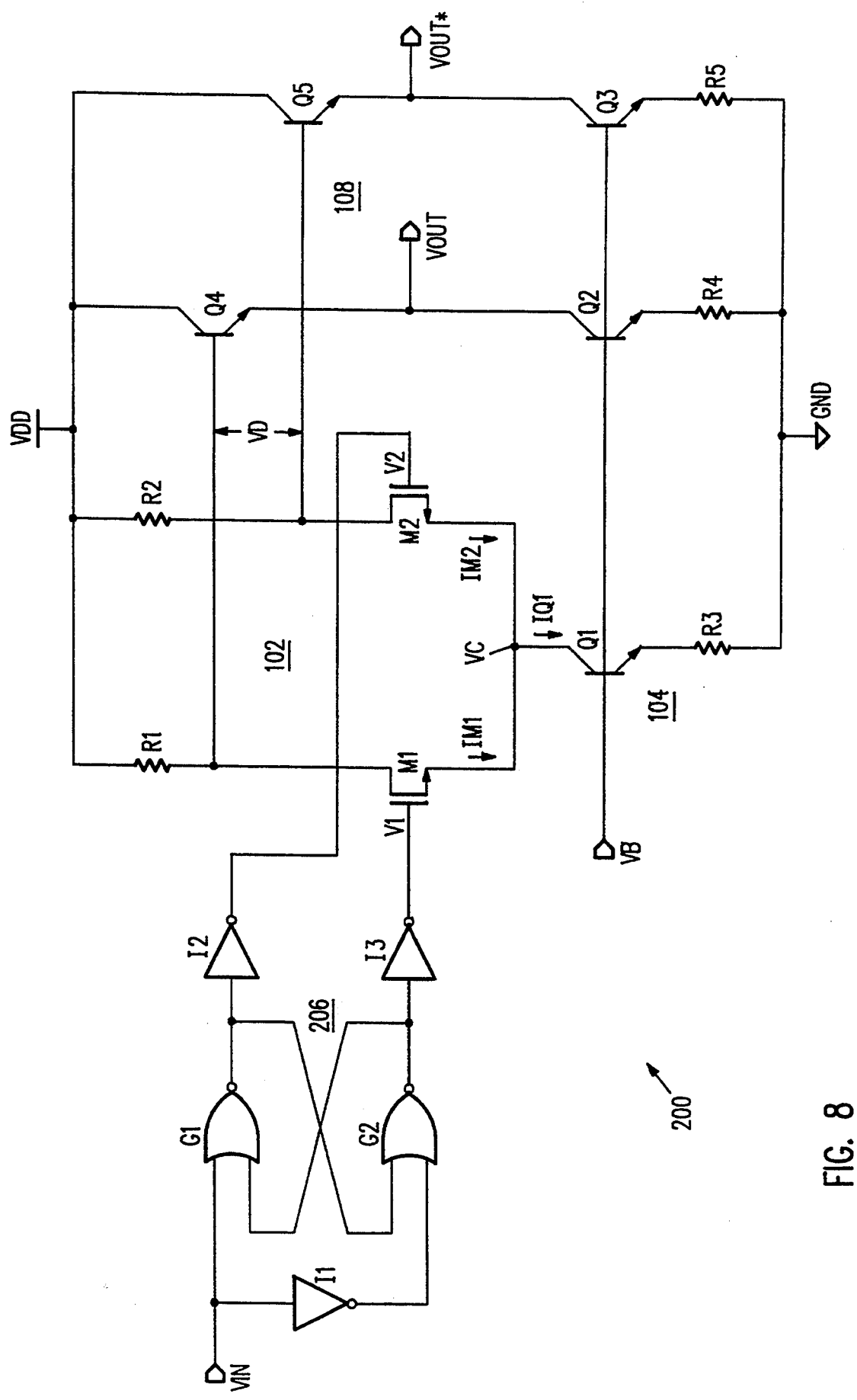
FIG. 8

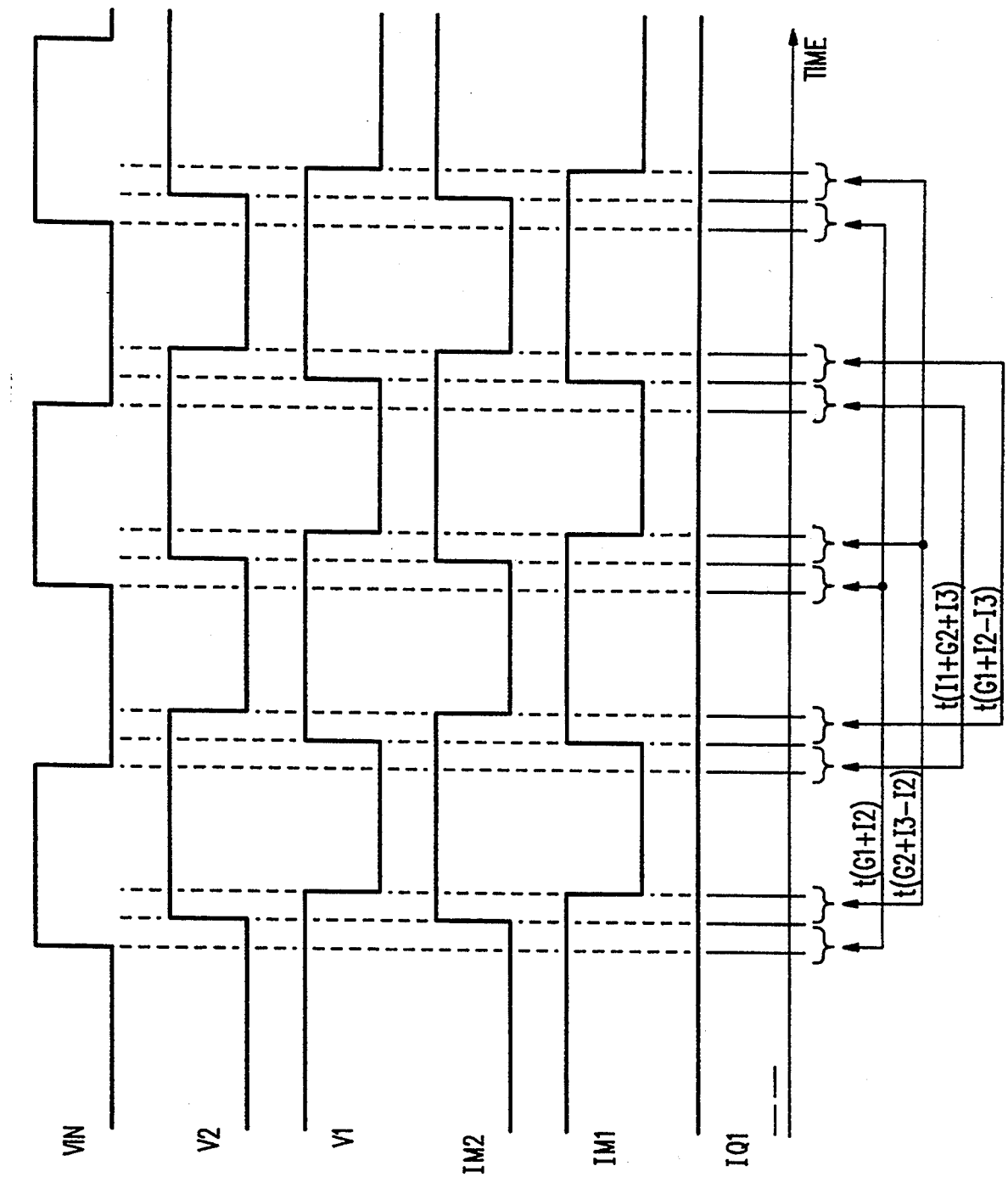
FIG. 9

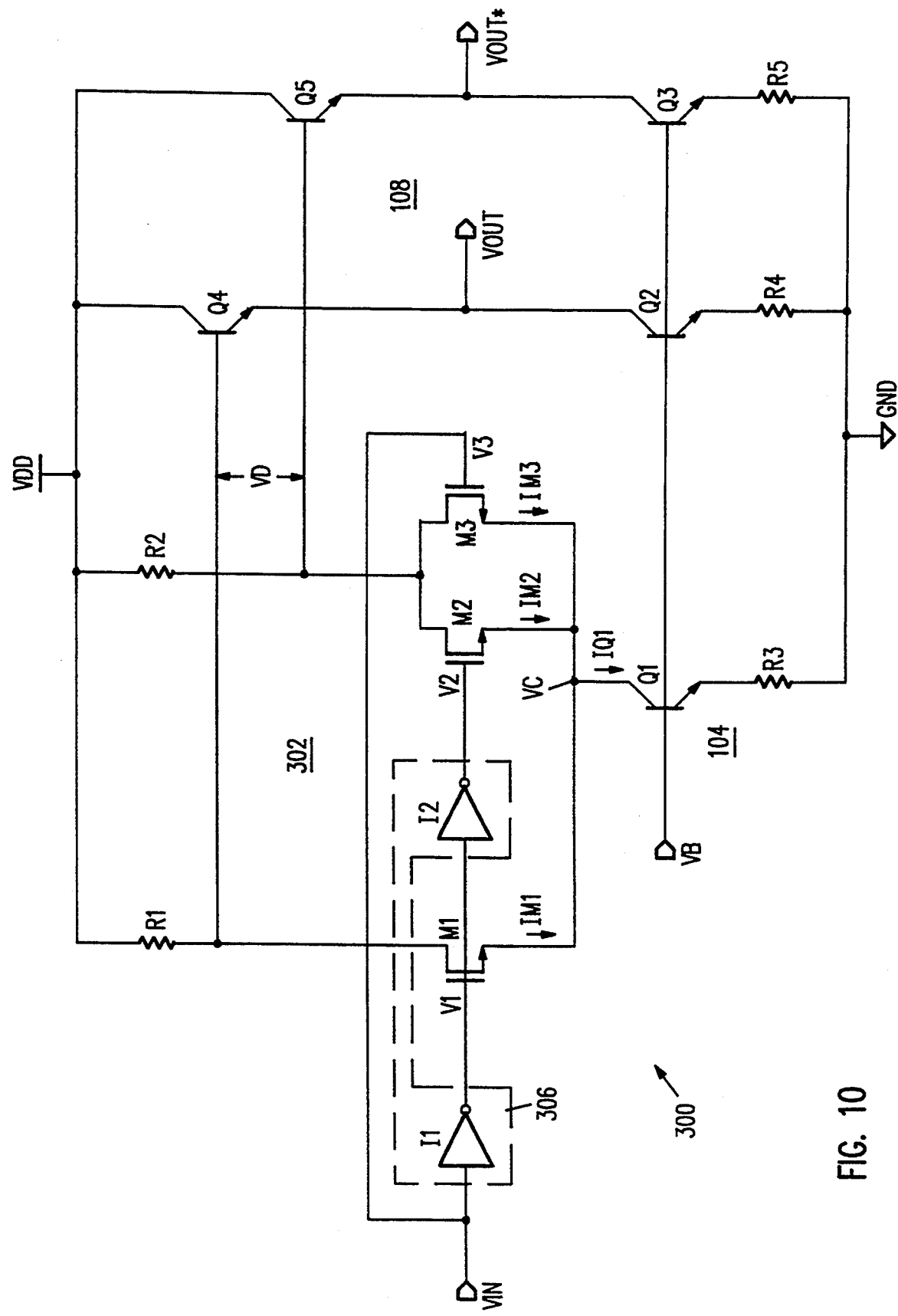
FIG. 10

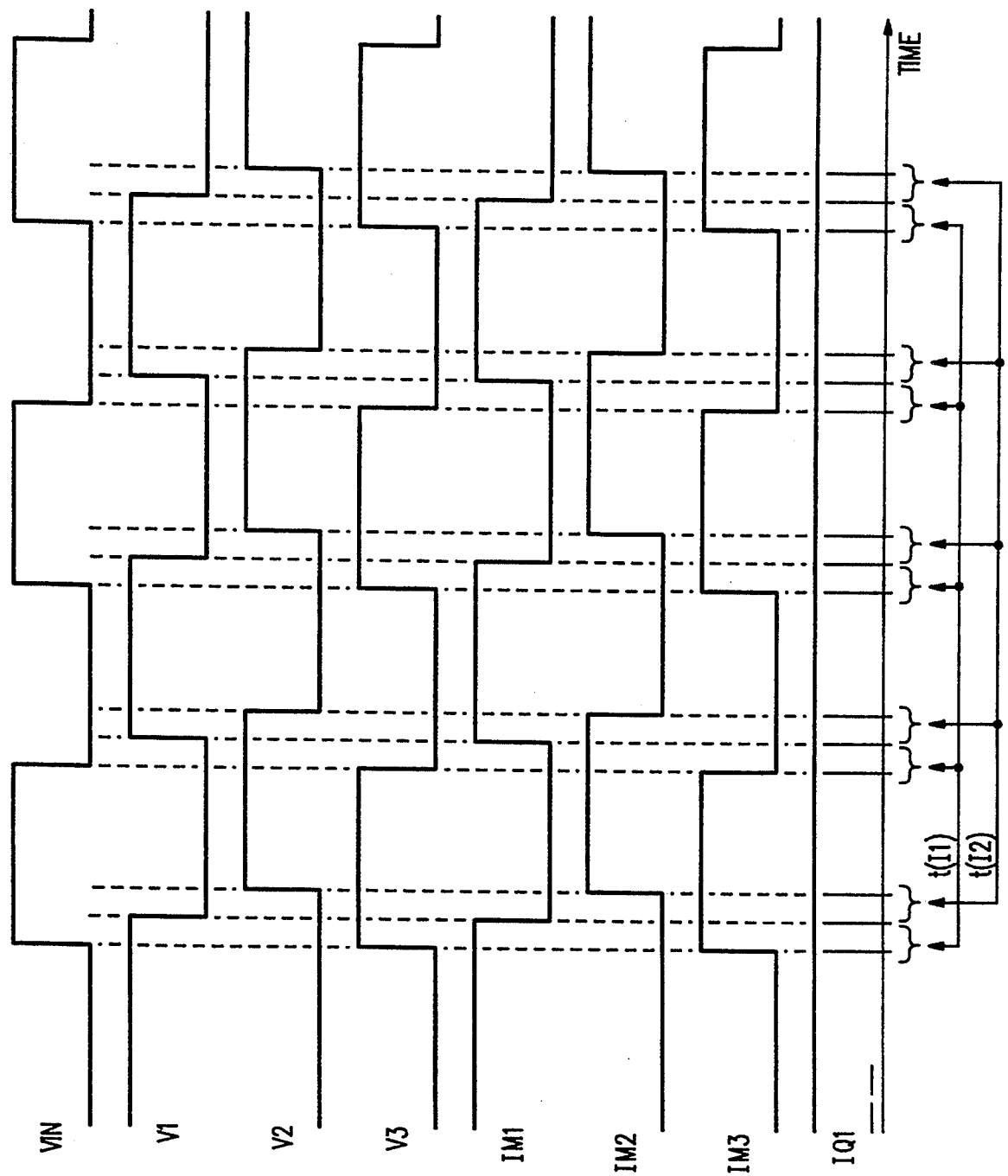
FIG. 11

LOW NOISE LOGIC AMPLIFIER WITH NONDIFFERENTIAL TO DIFFERENTIAL CONVERSION

BACKGROUND OF THE INVENTION

1. Field of the Invention

The present invention relates to logic amplifiers, and in particular, to logic amplifiers which receive and convert nondifferential logic signals to differential logic signals.

2. Description of the Related Art

As the number of different types of digital logic families and signals has grown, so has the need for logic amplifiers, or translators, for converting one type of logic signal to another. A good example of such a circuit is a logic amplifier which receives a nondifferential logic signal, such as one compatible with complementary metal oxide semiconductor ("CMOS") technology, and converts it to a differential logic signal compatible with common mode logic ("CML"), such as emitter-coupled logic ("ECL"). Such a circuit must receive and translate the CMOS signal (which has a signal amplitude swing between the power supply potential VDD and ground GND) to an ECL or CML signal (which has a signal amplitude swing of 800 millivolts ["mv"] or 400 mv, respectively).

Referring to FIG. 1, a conventional logic amplifier 10 for performing this function is shown. This amplifier 10 is biased between a positive voltage supply VDD and the circuit reference, i.e. ground GND, and includes an input amplifier 12, current source 14, biasing circuit 16 and output amplifier 18. As shown, the input amplifier 12 consists of two source-coupled metal oxide semiconductor field effect transistors ("MOSFETs") M1 and M2 whose drain terminals are tied to VDD by resistors R1 and R2, respectively. The current source 14, consisting of NPN bipolar junction transistor ("BJT") Q1 and resistor R3 biased by a fixed biasing voltage VB, provides a bias current for the input amplifier 12. (The fixed biasing voltage VB is typically provided by a reference voltage generating circuit called a "bandgap" circuit [not shown] which is powered by the main power supply VDD.) The biasing circuit 16 produces a fixed biasing voltage VA according to voltage dividing resistors R6 and R7. (The biasing voltage VA is typically fixed at VDD/2, e.g. 2.5 volts for VDD=5 volts.) Output amplifier 18 consists of transistor pairs Q4/Q2 and Q5/Q3 which are each coupled in a totem-pole configuration (along with resistors R4 and R5, respectively) and biased by a fixed biasing voltage VD. Parameters and component values for this circuit 10 are summarized below in Table 1.

TABLE 1

| FIGS. 1–4 | |
|---|---|
| VDD | 3.0 volts dc |
| VB | 1.2 volts dc |
| M1 | N-MOSFET |
| M2 | N-MOSFET |
| Q1 | NPN Bipolar |
| Q2 | NPN Bipolar |
| Q3 | NPN Bipolar |
| Q4 | NPN Bipolar |
| Q5 | NPN Bipolar |
| Q6 (FIG. 2) | NPN Bipolar |
| R1 | 20 KΩ |
| R2 | 20 KΩ |
| R3 | 20 KΩ |
| R4 | 30 KΩ |

TABLE 1-continued

| FIGS. 1–4 | |
|---|---|
| R5 | 30 KΩ |
| R6 | 10 KΩ (FIG. 1) |
| | 100 KΩ (FIG. 2) |
| R7 | 10 KΩ (FIG. 1) |
| | 20 KΩ (FIG. 2) |
| I1 | Bias Circuit (FIGS. 3, 3A) |
| | C-MOSFET Inverter (FIG. 4) |

The MOSFET M1 receives a single-ended, i.e. nondifferential, CMOS-compatible input signal VIN while MOSFET M2 receives a fixed biased voltage VA established by the voltage divider biasing circuit 16 of resistors R6 and R7. The result of these two inputs VIN and VA produce a differential output voltage VD across the drain terminals of MOSFETs M1 and M2. The output amplifier 18 receives this differential signal VD and converts it to two nondifferential output signals VOUT and VOUT* which together form the two phases of a differential output signal VOUT−VOUT* (where "X*" indicates a signal which is the inverse phase, i.e. ±180° [approx.], of signal "X").

Referring to FIG. 2, an alternative circuit 20 also includes the input amplifier 12, current source 14 and output amplifier 18, as discussed above. However, the biasing circuit 26 is different in that BJT Q6, biased by the biasing voltage VB, is used to generate the biasing voltage VA (e.g. as an active biasing voltage rather than as the passive biasing voltage generated by the passive biasing circuit 16 of FIG. 1). (Parameters and component values for this circuit 20 are summarized above in Table 1.)

Referring to FIG. 3, a further alternative circuit 30 also includes the input amplifier 12, current source 14 and output amplifier 18, as discussed above. However, yet another form of biasing circuit 36 is used for generating the biasing voltage VA. Inverter I1, with its input and output terminals connected together produce the biasing voltage VA. This type of active voltage divider biasing circuit 36 is well known in the art and is shown in FIG. 3A. Complementary MOSFETs MP and MN, with their source terminals connected to VDD and ground GND, respectively, and their gate and drain terminals all connected together, produce an active biasing voltage VA since both MOSFETs MP and MN are biased on and thereby effectively operate as a voltage divider between VDD and ground. As is known in the art, the actual DC voltage potential available at the output VA can be preselected by appropriately scaling the device geometries (e.g. the channel widths and lengths) of the two MOSFETs MP and MN. (Parameters and component values for this circuit 30 are summarized above in Table 1.)

These conventional circuits 10, 20, 30 have a number of disadvantages. One problem involves the amount of static power consumption in the biasing circuits 16, 26, 36 (due to the static current drain through resistors R6 and R7 [FIGS. 1 and 2] and MOSFETs MP and MN [FIG. 3A]). Another problem involves biasing problems encountered when the circuits 10, 20, 30 are operated at a low power supply voltage VDD. This problem arises when VDD falls below 3.0 volts. At such a low biasing voltage, the biasing voltage VA falls to where it may become too close in value to the dc potential VCQ1 at the collector of BJT Q1. With VB fixed (e.g. due to the relative insensitivity of the bandgap circuit to VDD) and VA falling with the lower VDD, the voltage difference VA−VCQ1 between them may not be sufficient to ensure that (1) MOSFET M2 is turned on when appropriate and (2) BJT Q1 stays out of saturation. (At a minimum, this difference VA−VCQ1 must be equal to or greater than the sum of the threshold V(TH) and saturation VDS(SAT) voltages for MOSFET M2 [e.g. 0.7+0.2=0.9].)

Referring to FIG. 4, another conventional circuit 40 has been implemented as an attempt to overcome the above-mentioned problem of static power consumption in the biasing circuits 16, 26, 36. In this circuit 40, no biasing circuit is used. Rather, the input signal VIN is fed directly to the gate of MOSFET M1, as before, and also to an inverter I1 so as to feed the inverse VIN* of the input signal VIN to the gate of MOSFET M2. In other words, the input amplifier 12 is now operated as a differential amplifier in that its input signals VIN and VIN* form the two signal phases of a differential input signal VIN−VIN*. (Parameters and component values for this circuit 40 are summarized above in Table 1.)

Ideally, the two input signals VIN and VIN* should be exactly out of phase and thereby cause MOSFETs M1 and M2 to alternate in their conductance of the biasing current IQ1 provided by the current source 14. In other words, the MOSFET currents IM1 and IM2 should ideally be exactly out of phase with one another and should each equal the biasing current IQ1. However, referring to FIG. 5A, such is not the case. The invertor I1, when inverting the input signal VIN to produce its inverse VIN*, introduces a slight time delay t(I1), or phase lag. Thus, the corresponding leading and trailing edges of the inverse phase VIN* lag those of the input phase VIN by this delay time t(I1).

Accordingly, the output signal currents IM1 and IM2 are also out of phase by t(I1). This means that for this brief period of time t(I1), during each high-to-low logic transition of the input VIN, neither MOSFET M1 nor M2 are conductive and neither output signal current IM1 nor output signal current IM2 flow within the input amplifier 12. Therefore, no current IQ1 is drawn from the current source 14 and BJT Q1 becomes saturated. This causes a perturbation in the voltage VC at the collector of BJT Q1. In turn, this introduces a noise spike into the biasing voltage VB, which can also affect the output amplifier 18 via BJTs Q2 and Q3. Referring to FIG. 5B, the effects of this phase delay t(I1) on the various signals or voltages VIN, VIN*, VOUT, VOUT* and VC can be better understood.

Therefore, it would be desirable to have a logic amplifier circuit which, while minimizing static power consumption, avoided introducing noise spikes into its bias lines or neighboring circuitry.

SUMMARY OF THE INVENTION

A logic amplifier in accordance with the present invention includes a differential logic amplifier and an input converter. In one preferred embodiment, the differential logic amplifier receives a bias current and a differential logic input signal, and in accordance therewith generates a differential logic output signal. In another preferred embodiment, the differential logic amplifier receives a bias current, a nondifferential logic input signal and a differential logic input signal, and in accordance therewith generates a differential logic output signal. In both of these embodiments, the input converter receives the nondifferential logic input signal and converts it to the differential logic input signal for use by the differential logic amplifier.

In accordance with the present invention, the differential logic amplifier includes multiple output signal current paths, each of which is selectively conductive for the differential logic amplifier bias current. At least one of the multiple output signal current paths is conductive for the biasing current uninterruptedly during high-to-low and low-to-high logic transitions of the differential logic input signal.

In further accordance with the present invention, continuously during the generating of the differential logic output signal, at least one of the output signal current paths is conductive for the bias current.

In still further accordance with the present invention, a bias current source is included to provide the bias current to the differential logic amplifier, and the bias current flows through the differential logic amplifier uninterruptedly during high-to-low and low-to-high logic transitions of the differential logic input signal.

In yet still further accordance with the present invention, a bias current source is included to provide the bias current to the differential logic amplifier, and the bias current flows through the differential logic amplifier continuously during the generating of the differential logic output signal.

These and other features and advantages of the present invention will be more readily understood upon consideration of the following detailed description of the invention and the accompanying drawings.

BRIEF DESCRIPTION OF THE DRAWINGS

FIG. 1 is a schematic diagram of a conventional logic amplifier circuit.

FIG. 2 is a schematic diagram of an alternative conventional logic amplifier circuit.

FIG. 3 is a schematic diagram of a further alternative conventional logic amplifier circuit.

FIG. 3A is a schematic diagram of a conventional active voltage divider biasing circuit.

FIG. 4 is a schematic diagram of a still further alternative conventional logic amplifier circuit.

FIGS. 5A and 5B depict various signal amplitude and phase relationships for the circuit of FIG. 4.

FIG. 6 is a schematic diagram of a logic amplifier in accordance with the present invention.

FIGS. 7A and 7B depict various signal amplitude and phase relationships for the circuit of FIG. 6.

FIG. 8 is a schematic diagram of an alternative preferred embodiment of a logic amplifier in accordance with the present invention.

FIG. 9 depicts various signal amplitude and phase relationships for the circuit of FIG. 8.

FIG. 10 is a schematic diagram of a further alternative preferred embodiment of a logic amplifier in accordance with the present invention.

FIG. 11 depicts various signal amplitude and phase relationships for the circuit of FIG. 10.

DETAILED DESCRIPTION OF THE INVENTION

Referring to FIG. 6, a preferred embodiment 100 of a logic amplifier in accordance with the present invention includes a differential input amplifier 102, current source 104, input converter 106 and output amplifier 108. Circuit parameters and component values are summarized below in Table 2.

TABLE 2

| FIGS. 6–8 | |
| --- | --- |
| VDD | 3.0 volts dc |
| VB | 1.2 volts dc |
| M1 | N-MOSFET |
| M2 | N-MOSFET |
| M3 (FIG. 8) | N-MOSFET |
| Q1 | NPN Bipolar |
| Q2 | NPN Bipolar |
| Q3 | NPN Bipolar |
| Q4 | NPN Bipolar |
| Q5 | NPN Bipolar |
| R1 | 20 KΩ |
| R2 | 20 KΩ |
| R3 | 20 KΩ |
| R4 | 30 KΩ |
| R5 | 30 KΩ |
| I1 | C-MOSFET Inverter |
| I2 (FIGS. 7–8) | C-MOSFET Inverter |
| I3 (FIG. 7) | C-MOSFET Inverter |
| G1 | C-MOSFET NAND (FIG. 6) |
|  | C-MOSFET NOR (FIG. 7) |
| G2 | C-MOSFET NAND (FIG. 6) |
|  | C-MOSFET NOR (FIG. 7) |

The differential input amplifier 102 consists of source-coupled MOSFETs M1 and M2 whose drain terminals are coupled to VDD via resistors R1 and R2 respectively. The differential input amplifier 102 receives a bias current IQ1 from the current source 104, which consists of NPN BJT Q1 and resistor R3 biased by a fixed bias voltage VB. The differential input amplifier 102 receives a differential input signal V1−V2 (at the gates of MOSFETs M1 and M2) and produces a differential output signal VD (across the drain terminals of MOSFETs M1 and M2). The output amplifier 108 receives this differential output signal VD (via the bases of BJTs Q4 and Q5) and produces a differential output signal VOUT−VOUT*.

The input converter 106 consists of cross-coupled NAND gates G1 and G2 and inverter I1, as shown. The nondifferential input signal VIN is converted by the input converter 106 to produce signals V1 and V2 which together, as the signal phases therefor, form the aforementioned differential input signal V1−V2. As should be understood, when signal V1 is a logical high signal, MOSFET M1 is conductive and output signal current IM1 (MOSFET M1 drain current) flows therethrough. Similarly, when signal V2 is a logical high, MOSFET M2 is conductive and output signal current IM2 (MOSFET M2 drain current) flows therethrough. As discussed further below, the input signals V1 and V2 have amplitudes and phases relative to one another such that either output signal current IM1 or IM2, or both, flows continuously. This prevents saturation of the current source transistor Q1 and any perturbation in the bias current IQ1 and MOSFETs' source voltage VC.

Referring to FIG. 7A, this can be better understood. Signals V1 and V2, generated from the input signal VIN by the input converter 106, are approximately opposite in phase from one another. The leading edge of signal V1 is delayed relative to the leading edge of input VIN by the time delay t(I1+G2) introduced by the inverter I1 and gate G2. The leading edge of signal V2 is delayed relative to the leading edge of signal V1 by the time delay t(G1) introduced by gate G1. Similarly, the trailing edge of signal V2 is delayed from the trailing edge of input VIN by the time delay t(G1) introduced by gate G1, and the trailing edge of signal V1 is delayed from the trailing edge of signal V2 by the time delay t(G2) introduced by gate G2. (The phase differences depicted have been exaggerated for clarity.)

It can be seen from the amplitude and phase relationships depicted in FIG. 7A that the signals V1 and V2 produced by the input converter 106 have duty cycles (positive) which exceed 50%. This advantageously causes continuous flow of output signal current (IM1 or IM2, or both) during the generating of the differential output signal VD. As can be seen in FIG. 7A, the duty cycles of signals V1 and V2 cause continuous flow of the bias current IQ1 in the form of MOSFET current IM1 or IM2, or in some instances both IM1 and IM2 together. In other words, most of the time, either MOSFET current IM1 or IM2 flows. However, for short periods of time immediately following the leading and trailing edges of the input signal VIN, both IM1 and IM2 flow. Therefore, the bias current IQ1 flows without interruption during all logic transitions (high-to-low and low-to-high) of the input signal VIN.

Referring to FIG. 7B, the above-discussed amplitude and phase relationships of the signals V1 and V2 produced by the input converter 106 advantageously prevent perturbations in the bias current IQ1 and bias voltage VC. Accordingly, generation and injection of noise spikes into the bias voltage VB, and therefore the output amplifier 108 (via the bases of BJTs Q2 and Q3) is prevented.

Referring to FIG. 8, an alternative preferred embodiment 200 of a logic amplifier in accordance with the present invention uses a different form of input converter 206. (Circuit parameters and component values are summarized above in Table 2.) In this embodiment 200, the input converter 206 consists of cross-coupled NOR gates G1, G2, and inverters I1, I2, I3, as shown. Circuit operation for this embodiment 200 is similar to that discussed above for the embodiment 100 shown in FIG. 6. As seen in FIG. 9, the relative amplitudes and phases of the signals V1 and V2 produced by the input converter 206 from the input signal VIN are inverse to those for the embodiment 100 of FIG. 6. Also, the time delays differ somewhat due to the different configuration of gates G1, G2 and inverters I1, I2, I3 used in this particular input converter 206.

Referring to FIG. 10, a further alternative preferred embodiment 300 of a logic amplifier in accordance with the present invention uses a different differential input amplifier 302 and input converter 306. In this differential input amplifier 302, one branch of its output circuit consists of two MOSFETs M2 and M3 connected in parallel. Thus, three different MOSFET currents IM1, IM2, IM3, or combinations thereof, can flow as the bias current IQ1. MOSFET M3 receives an input signal V3, which is the same as the input signal VIN. The MOSFETs M1 and M2 receive their input signals V1 and V2 as output signals from the inverters I1 and I2 which form the input converter 306. Referring to FIG. 11, the relative amplitudes and phases of the various signals VIN, V1, V2 and V3 can be seen. Due to the time delays introduced by the inverters I1 and I2, the leading and trailing edges of signals V1 and V2 are delayed relative to the leading and trailing edge of VIN (and V3).

From the foregoing, it can be appreciated that a logic amplifier in accordance with the present invention avoids generating noise spikes which occur when a nondifferential signal is converted to a true differential signal. In accordance with the present invention, an approximate, or quasi, differential signal is first generated in which overlapping signal phases are used to ensure continuous bias current flow, particularly during all logic transitions of the input signal. This advantageously avoids abrupt changes in bias current flow which can generate and inject noise spikes into other signals or circuitry.

From the foregoing, it can be further appreciated that a logic amplifier in accordance with the present invention has an input nondifferential-to-differential signal converter which selectively alters the "lengths" of, i.e. the time delays associated with, the signal paths responsible for generating the differential input signal phases from the nondifferential input signal. For each logic transition of the nondifferential input signal (VIN), the signal path which provides the differential input signal phase (e.g. V1 [FIG. 6]) responsible for turning a branch of the differential amplifier ON (MOSFET M1 conductive) is made "shorter", or "faster", than the other signal path which provides the inverse differential input signal phase (V2) responsible for turning the other branch of the differential amplifier OFF (MOSFET M2 nonconductive).

Other modifications and alterations in the structure and method of operation of this invention will be apparent to those skilled in the art without departing from the scope and spirit of the invention. Although the invention has been described above in connection with specific preferred embodiments, the invention as claimed should not be unduly limited to such specific embodiments.

What is claimed is:

1. A logic amplifier for converting a nondifferential logic signal to a differential logic signal, comprising:
    differential logic amplifier means for receiving a bias current and a first differential logic signal, and in accordance therewith generating a second differential logic signal, wherein said differential logic amplifier means includes a plurality of output signal current paths of which each is selectively conductive for said bias current; and
    input converter means coupled to said differential logic amplifier means for receiving and converting a nondifferential logic signal to provide said first differential logic signal;
wherein said first differential logic signal includes a plurality of signal phases with high and low logic levels having high-to-low and low-to-high logic transitions between said high and low logic levels, and further wherein at least one of said plurality of output signal current paths is conductive for said bias current uninterruptedly during said high-to-low and low-to-high logic transitions.

2. A logic amplifier as recited in claim 1, wherein said differential logic amplifier means comprises a plurality of source-coupled metal oxide semiconductor field effect transistors.

3. A logic amplifier as recited in claim 1, wherein said input converter means comprises a plurality of cross-coupled NAND gates.

4. A logic amplifier as recited in claim 1, wherein said input converter means comprises a plurality of cross-coupled NOR gates.

5. A logic amplifier as recited in claim 1, further comprising output converter means coupled to said differential logic amplifier means for receiving and converting said second differential logic signal to a third differential logic signal.

6. A logic amplifier as recited in claim 5, wherein said output converter means comprises a plurality of bipolar junction transistors mutually coupled in a totem-pole configuration.

7. A logic amplifier for converting a nondifferential logic signal to a differential logic signal, comprising:
    differential logic amplifier means for receiving a bias current, a nondifferential logic signal and a first differential logic signal, and in accordance therewith generating a second differential logic signal, wherein said differential logic amplifier means includes a plurality of output signal current paths of which each is selectively conductive for said bias current; and
    input converter means coupled to said differential logic amplifier means for receiving and converting said nondifferential logic signal to provide said first differential logic signal;
wherein said first differential logic signal includes a plurality of signal phases with high and low logic levels having high-to-low and low-to-high logic transitions between said high and low logic levels, and further wherein at least one of said plurality of output signal current paths is conductive for said bias current uninterruptedly during said high-to-low and low-to-high logic transitions.

8. A logic amplifier as recited in claim 7, wherein said differential logic amplifier means comprises a plurality of source-coupled metal oxide semiconductor field effect transistors.

9. A logic amplifier as recited in claim 7, wherein said input converter means comprises a plurality of serially-coupled inverters.

10. A logic amplifier as recited in claim 7, further comprising output converter means coupled to said differential logic amplifier means for receiving and converting said second differential logic signal to a third differential logic signal.

11. A logic amplifier as recited in claim 10, wherein said output converter means comprises a plurality of bipolar junction transistors mutually coupled in a totem-pole configuration.

12. A logic amplifier for converting a nondifferential logic signal to a differential logic signal, comprising:
    a differential logic amplifier which includes a bias port for receiving a bias current, an input port for receiving a first differential logic signal, an output port for providing a second differential logic signal and a plurality of output signal current paths connected to said bias port, wherein each one of said plurality of output signal current paths is selectively conductive for said bias current; and
    an input amplifier which includes an input port for receiving a nondifferential logic signal and an output port coupled to said differential logic amplifier input port for providing said first differential logic signal;
wherein said first differential logic signal includes a plurality of signal phases with high and low logic levels having high-to-low and low-to-high logic transitions between said high and low logic levels, and further wherein at least one of said plurality of output signal current paths is conductive for said bias current uninterruptedly during said high-to-low and low-to-high logic transitions.

13. A logic amplifier as recited in claim 12, wherein said differential logic amplifier comprises a plurality of metal oxide semiconductor field effect transistors with source terminals which are mutually coupled and said bias port comprises said mutually coupled source terminals.

14. A logic amplifier as recited in claim 12, wherein said input amplifier comprises a plurality of cross-coupled NAND gates.

15. A logic amplifier as recited in claim 12, wherein said input amplifier comprises a plurality of cross-coupled NOR gates.

16. A logic amplifier as recited in claim 12, further comprising an output amplifier which includes an input port coupled to said differential logic amplifier output port for receiving said second differential logic signal and includes an output port for providing a third differential logic signal.

17. A logic amplifier as recited in claim 16, wherein said output amplifier comprises a plurality of bipolar junction transistors mutually coupled in a totem-pole configuration.

18. A logic amplifier for converting a nondifferential logic signal to a differential logic signal, comprising:
a differential logic amplifier which includes a bias port for receiving a bias current, a nondifferential input port for receiving a nondifferential logic signal, a differential input port for receiving a first differential logic signal, an output port for providing a second differential logic signal and a plurality of output signal current paths connected to said bias port, wherein each one of said plurality of output signal current paths is selectively conductive for said bias current; and
an input amplifier which includes an input port for receiving said nondifferential logic signal and an output port coupled to said differential logic amplifier differential input port for providing said first differential logic signal;
wherein said first differential logic signal includes a plurality of signal phases with high and low logic levels having high-to-low and low-to-high logic transitions between said high and low logic levels, and further wherein at least one of said plurality of output signal current paths is conductive for said bias current uninterruptedly during said high-to-low and low-to-high logic transitions.

19. A logic amplifier as recited in claim 18, wherein said differential logic amplifier comprises a plurality of metal oxide semiconductor field effect transistors with source terminals which are mutually coupled and said bias port comprises said mutually coupled source terminals.

20. A logic amplifier as recited in claim 18, wherein said input amplifier comprises a plurality of serially-coupled inverters.

21. A logic amplifier as recited in claim 18, further comprising an output amplifier which includes an input port coupled to said differential logic amplifier output port for receiving said second differential logic signal and includes an output port for providing a third differential logic signal.

22. A logic amplifier as recited in claim 21, wherein said output amplifier comprises a plurality of bipolar junction transistors mutually coupled in a totem-pole configuration.

23. A logic amplifier for converting a nondifferential logic signal to a differential logic signal, comprising:
differential logic amplifier means for receiving a bias current and a first differential logic signal, and in accordance therewith generating a second differential logic signal;
bias current source means coupled to said differential logic amplifier means for providing said bias current; and
input converter means coupled to said differential logic amplifier means for receiving and converting a nondifferential logic signal to provide said first differential logic signal;
wherein said first differential logic signal includes a plurality of signal phases with high and low logic levels having high-to-low and low-to-high logic transitions between said high and low logic levels, and further wherein said bias current flows uninterruptedly through said differential logic amplifier means during said high-to-low and low-to-high logic transitions.

24. A logic amplifier as recited in claim 23, wherein said differential logic amplifier means comprises a plurality of metal oxide semiconductor field effect transistors with source terminals which are mutually coupled.

25. A logic amplifier as recited in claim 24, wherein said bias current source means comprises a tail current source coupled to said mutually coupled source terminals of said plurality of metal oxide semiconductor field effect transistors.

26. A logic amplifier as recited in claim 23, wherein said bias current source means comprises a tail current source.

27. A logic amplifier as recited in claim 23, wherein said input converter means comprises a plurality of cross-coupled NAND gates.

28. A logic amplifier as recited in claim 23, wherein said input converter means comprises a plurality of cross-coupled NOR gates.

29. A logic amplifier as recited in claim 23, further comprising output converter means coupled to said differential logic amplifier means for receiving and converting said second differential logic signal to a third differential logic signal.

30. A logic amplifier as recited in claim 29, wherein said output converter means comprises a plurality of bipolar junction transistors mutually coupled in a totem-pole configuration.

31. A logic amplifier for converting a nondifferential logic signal to a differential logic signal, comprising:
differential logic amplifier means for receiving a bias current, a nondifferential logic signal and a first differential logic signal, and in accordance therewith generating a second differential logic signal;
bias current source means coupled to said differential logic amplifier means for providing said bias current; and
input converter means coupled to said differential logic amplifier means for receiving and converting said nondifferential logic signal to provide said first differential logic signal;
wherein said first differential logic signal includes a plurality of signal phases with high and low logic levels having high-to-low and low-to-high logic transitions between said high and low logic levels, and further wherein said bias current flows uninterruptedly through said differential logic amplifier means during said high-to-low and low-to-high logic transitions.

32. A logic amplifier as recited in claim 31, wherein said differential logic amplifier means comprises a plurality of metal oxide semiconductor field effect transistors with source terminals which are mutually coupled.

33. A logic amplifier as recited in claim 32, wherein said bias current source means comprises a tail current source coupled to said mutually coupled source terminals of said plurality of metal oxide semiconductor field effect transistors.

34. A logic amplifier as recited in claim 31, wherein said bias current source means comprises a tail current source.

35. A logic amplifier as recited in claim 31, wherein said input converter means comprises a plurality of serially-coupled inverters.

36. A logic amplifier as recited in claim 31, further comprising output converter means coupled to said differential logic amplifier means for receiving and converting said second differential logic signal to a third differential logic signal.

37. A logic amplifier as recited in claim 36, wherein said output converter means comprises a plurality of bipolar junction transistors mutually coupled in a totem-pole configuration.

38. A logic amplifier for converting a nondifferential logic signal to a differential logic signal, comprising:
a differential logic amplifier which includes a bias port for receiving a bias current, an input port for receiving a first differential logic signal and an output port for providing a second differential logic signal;
a bias current source which includes a current port coupled to said differential logic amplifier bias port for providing said bias current; and
an input amplifier which includes an input port for receiving a nondifferential logic signal and an output port coupled to said differential logic amplifier input port for providing said first differential logic signal;
wherein said first differential logic signal includes a plurality of signal phases with high and low logic levels having high-to-low and low-to-high logic transitions between said high and low logic levels, and further wherein said bias current flows uninterruptedly through said differential logic amplifier during said high-to-low and low-to-high logic transitions.

39. A logic amplifier as recited in claim 38, wherein said differential logic amplifier comprises a plurality of metal oxide semiconductor field effect transistors with source terminals which are mutually coupled and said bias port comprises said mutually coupled source terminals.

40. A logic amplifier as recited in claim 39, wherein said bias current source means comprises a tail current source.

41. A logic amplifier as recited in claim 38, wherein said bias current source means comprises a tail current source.

42. A logic amplifier as recited in claim 38, wherein said input amplifier comprises a plurality of cross-coupled NAND gates.

43. A logic amplifier as recited in claim 38, wherein said input amplifier comprises a plurality of cross-coupled NOR gates.

44. A logic amplifier as recited in claim 38, further comprising an output amplifier which includes an input port coupled to said differential logic amplifier output port for receiving said second differential logic signal and includes an output port for providing a third differential logic signal.

45. A logic amplifier as recited in claim 44, wherein said output amplifier comprises a plurality of bipolar junction transistors mutually coupled in a totem-pole configuration.

46. A logic amplifier for converting a nondifferential logic signal to a differential logic signal, comprising:
a differential logic amplifier which includes a bias port for receiving a bias current, a nondifferential input port for receiving a nondifferential logic signal, a differential logic input port for receiving a first differential logic signal and an output port for providing a second differential logic signal;
a bias current source which includes a current port coupled to said differential logic amplifier bias port for providing said bias current; and
an input amplifier which includes an input port for receiving said nondifferential logic signal and an output port coupled to said differential logic amplifier differential input port for providing said first differential logic signal;
wherein said first differential logic signal includes a plurality of signal phases with high and low logic levels having high-to-low and low-to-high logic transitions between said high and low logic levels, and further wherein said bias current flows uninterruptedly through said differential logic amplifier during said high-to-low and low-to-high logic transitions.

47. A logic amplifier as recited in claim 46, wherein said differential logic amplifier comprises a plurality of metal oxide semiconductor field effect transistors with source terminals which are mutually coupled and said bias port comprises said mutually coupled source terminals.

48. A logic amplifier as recited in claim 47, wherein said bias current source means comprises a tail current source.

49. A logic amplifier as recited in claim 46, wherein said bias current source means comprises a tail current source.

50. A logic amplifier as recited in claim 46, wherein said input amplifier comprises a plurality of serially-coupled inverters.

51. A logic amplifier as recited in claim 46, further comprising an output amplifier which includes an input port coupled to said differential logic amplifier output port for receiving said second differential logic signal and includes an output port for providing a third differential logic signal.

52. A logic amplifier as recited in claim 51, wherein said output amplifier comprises a plurality of bipolar junction transistors mutually coupled in a totem-pole configuration.

* * * * *